(12) United States Patent
Okuda

(10) Patent No.: US 6,373,718 B2
(45) Date of Patent: Apr. 16, 2002

(54) CONSTRUCTION OF FIXING FLEXIBLE SHEET ON ELECTRONIC DEVICE

(75) Inventor: Tatsumi Okuda, Gifu (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/795,448

(22) Filed: Mar. 1, 2001

(30) Foreign Application Priority Data

Mar. 2, 2000 (JP) ........................................ 2000-057154

(51) Int. Cl.[7] ................................................ H05K 7/02
(52) U.S. Cl. ........................ 361/814; 361/753; 455/90; 379/440
(58) Field of Search ................................. 361/728, 749, 361/752, 801, 814, 753; 379/440, 443; 455/90

(56) References Cited

U.S. PATENT DOCUMENTS

| | | | | |
|---|---|---|---|---|
| 5,596,487 A | * | 1/1997 | Castaneda et al. | 361/814 |
| 5,832,371 A | * | 11/1998 | Thornton | 455/90 |
| 5,963,434 A | * | 10/1999 | Jonsson et al. | 361/814 |
| 6,088,240 A | * | 7/2000 | Steinhoff et al. | 361/814 |
| 6,201,712 B1 | * | 3/2001 | Barnett | 361/814 |
| 6,275,390 B1 | * | 8/2001 | Wu et al. | 361/818 |

* cited by examiner

Primary Examiner—Jayprakash N. Gandhi
(74) Attorney, Agent, or Firm—Armstront, Westerman & Hattori, LLP.

(57) ABSTRACT

A compact electronic device of portable type comprises a flexible sheet 3 on which a plurality of flexible switches 2 are arranged and having a flat board portion 4 being in close contact with a surface of a chassis 1 and a flat cable portion 5 extending from the flat plate portion 4. Provided on an end of the flat cable portion 5 is a terminal portion 6 to be connected to the connector 32 on a circuit board 31. Formed on an end portion of the chassis 1 is a lift-up prevention piece 8 for preventing a part of the flat plate portion 4 of the flexible sheet 3 from being lifted up from a surface of the chassis 1. The lift-up prevention piece 8 is not only constructed as to pass the flat cable portion 5 of the flexible sheet 3 through, but also can be formed into a hook-shape to hook the flat cable portion 5 of the flexible sheet 3.

4 Claims, 7 Drawing Sheets

CONSTRUCTION OF FIXING FLEXIBLE SHEET ON ELECTRONIC DEVICE

FIELD OF INVENTION

The present invention relates to the construction of fixing a flexible sheet on to a chassis with electronic devices such as a portable telephone, etc.

BACKGROUND OF THE INVENTION

A portable telephone, as shown in FIG. 5, generally comprises an upper case and a lower case which form a flat housing. A circuit board unit is accommodated in the housing. Disposed on a circuit board unit is a chassis having a flexible sheet made from synthetic resin mounted thereon, as shown in FIG. 6. A plurality of flexible switches are formed on the flexible sheet. The elasticity of the flexible sheet enables the user to turn on/off the flexible switch. A pair of terminals are closed or opened by the on/off manipulation.

FIG. 8(a) shows that the flexible sheet is electrically connected to a circuit board provided below the chassis. Respective manual buttons, as shown in FIG. 5, arranged above flexible switches are inserted into holes provided with the upper case in corresponding to a position of each flexible switch, whereby the manual buttons can be depressed externally from the case.

A liquid crystal panel is also disposed on the chassis, and fitted to an opening provided with the upper case in corresponding to a position for fixing the panel. The display of the panel can be viewed externally from the case through a transparent resin cover covering the opening. An antenna and an RF circuit are provided on the lower case.

A flexible sheet comprises, as shown in FIG. 7, a flat plate portion on which a plurality of flexible switches are arranged and a flat cable portion which has a terminal portion to be connected to a connector on the circuit board. FIG. 8(a) shows that the flat plate portion is in close contact with a surface of the chassis, and the flat cable portion is folded on a side of the chassis to have the portion connected to a connector on the circuit board disposed below the chassis.

The flat plate portion on the flexible sheet is so designed as to be in close contact with the chassis, as stated above. As shown in FIG. 8(a), the flat cable portion of the flexible sheet is folded back to have the terminal portion inserted into the connector on the circuit board, so that there arises the problem that a part of the flexible sheet is lifted up from the chassis, as shown in FIG. 8(b).

Portable telephones have been made compact and reduced in weight in recent years and an interior of a case is reduced in space. The flexible sheet is, therefore, liable to interfere with interior constructs. Since a part of the flexible sheet is lifted up as shown in FIG. 8(b) to produce reaction force and clearance, the problems are encountered that when an user depresses a manual button to function integrally with a flexible switch, he feels a dull click, or that a switch is positioned in an oblique direction to have the switch locked and not returned, or that when an user depresses a switch, noise is produced by the interference with the surrounding parts.

SUMMARY OF THE INVENTION

In view of the foregoing problems the present invention provides an electronic device comprising a case which is formed with a plurality of through holes, a chassis which is accommodated in an interior of the case, a flexible sheet which is mounted on the surface of the chassis and has a plurality of flexible switches arranged thereon, a circuit board which is disposed below the chassis and has a connector installed thereon, and a plurality of manual buttons which are disposed above respective flexible switches and project outwardly of a case through the through holes of the case. The flexible sheet has a flat plate portion to be in close contact with the chassis and a flat cable portion which extends on the edge of the flat plate portion and provided with a connecting terminal portion on its end. The flat cable portion is folded back toward the chassis to cause the connecting terminal portion to connect to the connector. The chassis is formed with a lift-up prevention piece for preventing a part of the flat plate portion of the flexible sheet from being lifted up from a surface of the chassis.

With the construction of fixing the flexible sheet, a lift-up prevention piece holds the flat cable portion of the flexible sheet, preventing a part of the flexible sheet from being lifted up.

The lift-up prevention piece, for example, has a through hole into which the flat cable portion of the flexible sheet is inserted, holding the flat cable portion of the flexible sheet.

The lift-up prevention piece is alternatively formed into a shape of hook to hook the flat cable portion of the flexible sheet, holding the flat cable portion of the flexible sheet.

The present invention is adapted to restrain a part of the flexible sheet from being lifted up, whereby the faulty action including dull click of the flexible switch and locking resulted from the reaction force or clearance caused by the lift-up.

DETAILED DESCRIPTION OF EMBODIMENTS

The examples of the invention will be described below in detail with reference to drawings. The invention is not limited to the embodiments of portable telephones, but can be applied to various modes of electronic devices if a flexible sheet or flexible switch which is used in an interior of a case has the same figure as in the invention.

Figure 1:
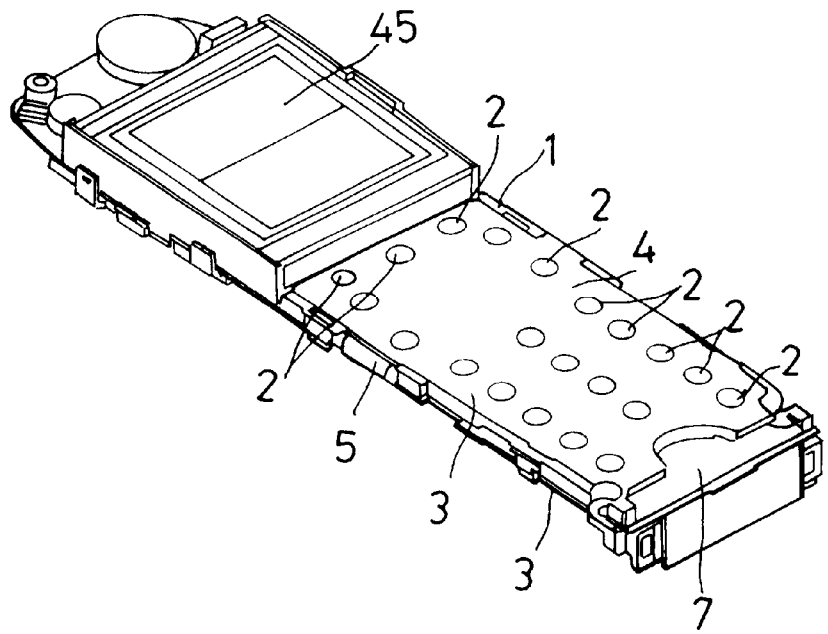
FIG. 1(a) is a perspective view showing a circuit board unit of a portable telephone of the invention.
FIG. 1(b) is an enlarged fragmentary perspective view showing the circuit board unit.
Figure 1:
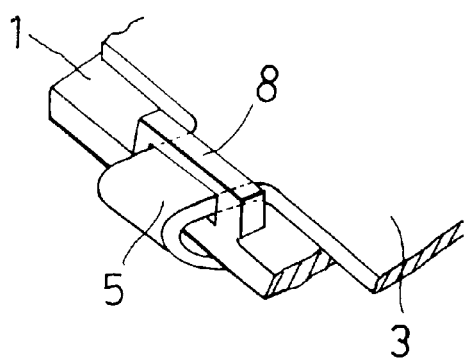
Figure 4:
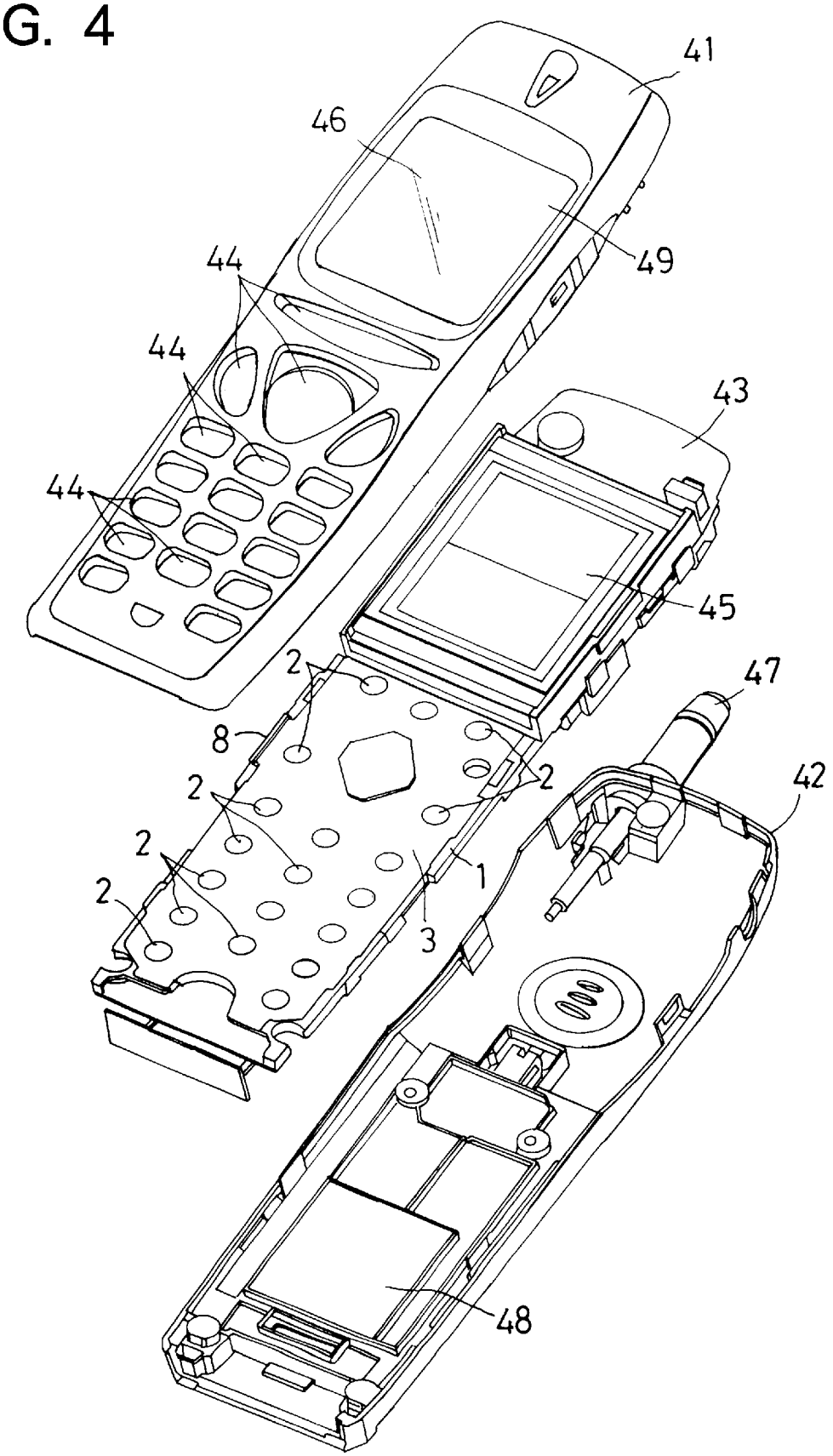
FIG. 4 is an exploded perspective view of a portable telephone of the invention.
Figure 5:
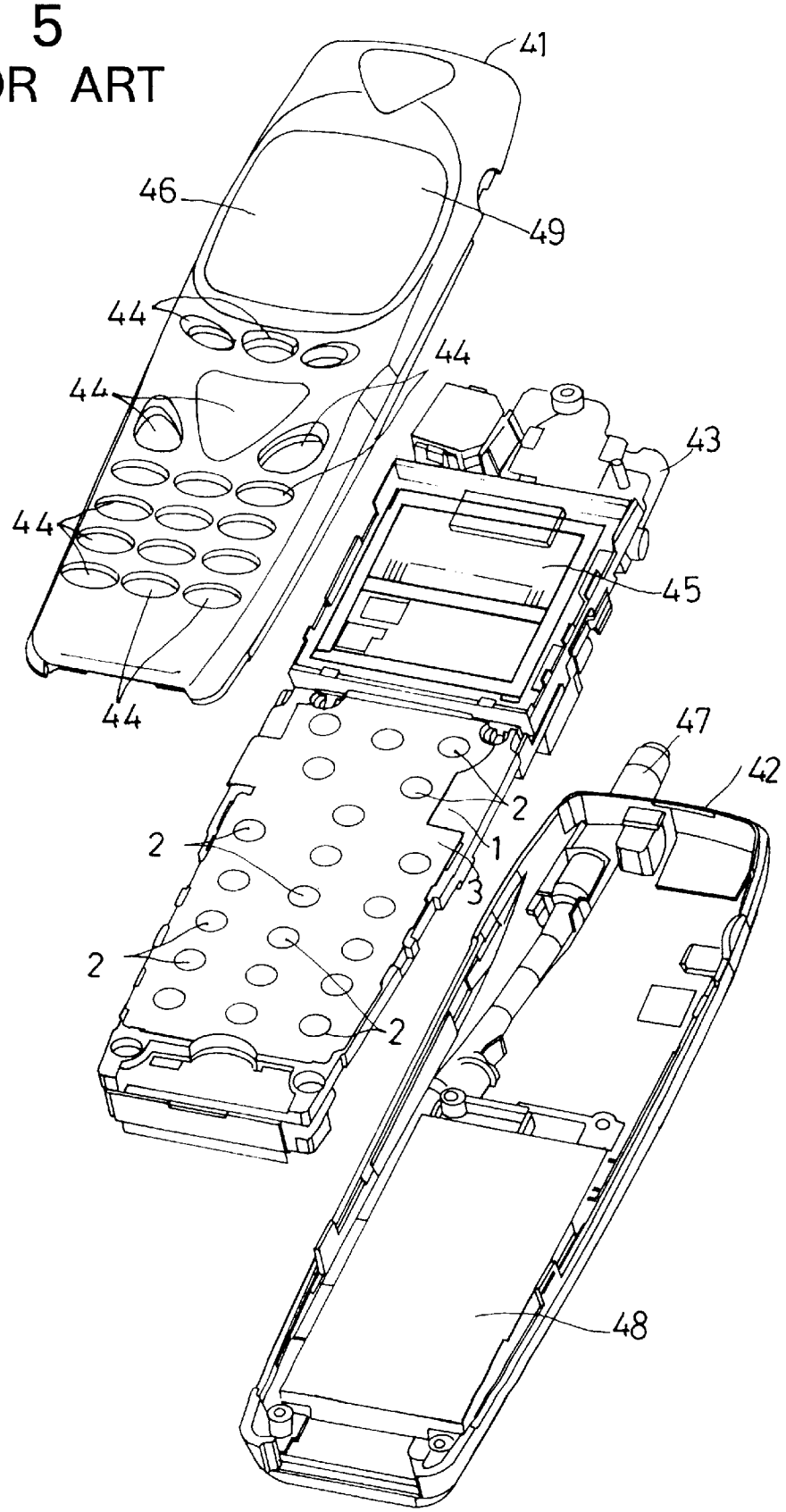
FIG. 5 is an exploded perspective view of a conventional portable telephone.
Figure 6:
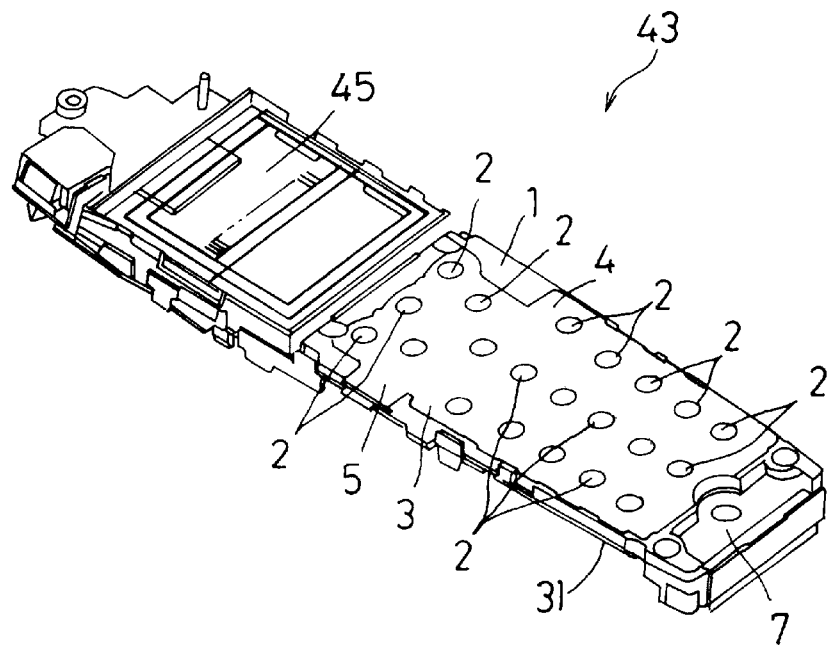
FIG. 6 is a perspective view showing a circuit board unit of the portable telephone.
Figure 7:
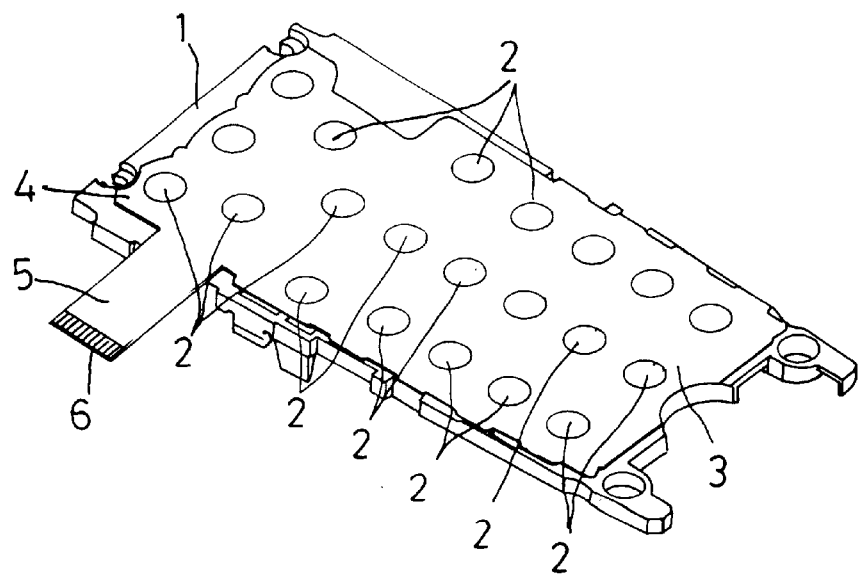
FIG. 7 is a perspective view showing the shape of a chassis and a flexible sheet.
Figure 8:
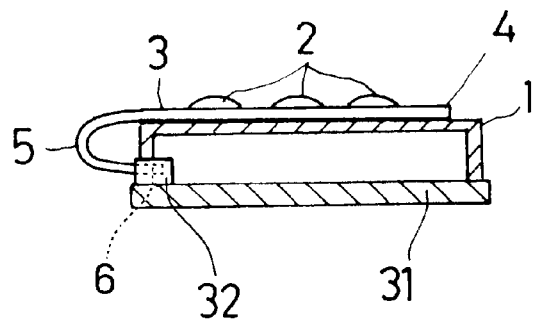
FIG. 8(a) is a view in section showing construction of fixing a conventional flexible sheet.
FIG. 8(b) is an enlarged fragmentary view in section showing the construction.
Figure 8:
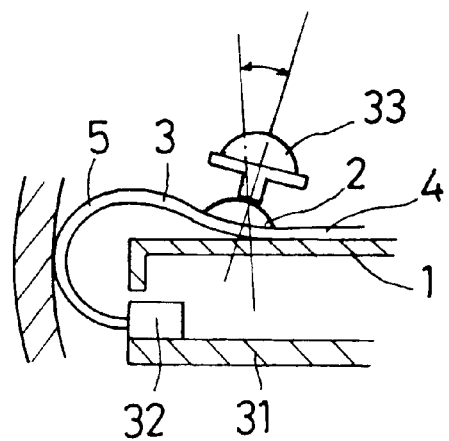

Referring to FIG. 4, the portable telephone of the invention has a flat housing comprising an upper case 41 and a lower case 42, and a circuit board unit 43 is accommodated in the housing. With reference to FIG. 1(a), disposed on a circuit board 43 is a chassis 1 having a flexible sheet 3 made from a synthetic resin mounted thereon. The flexible sheet 3 is formed with a plurality of flexible switches 2. The elasticity of the flexible sheet 3 enables the user to turn the switch 2 on/off. A pair of terminals are closed or opened by the on/off manipulation.

Figure 3:
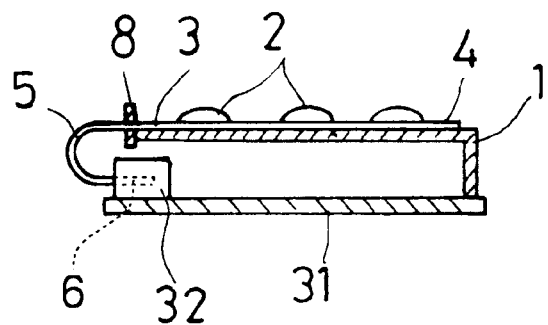
FIG. 3(a) is a view in section of construction of fixing a flexible sheet.
FIG. 3(b) is an enlarged fragmentary view in section showing the construction.
Figure 3:
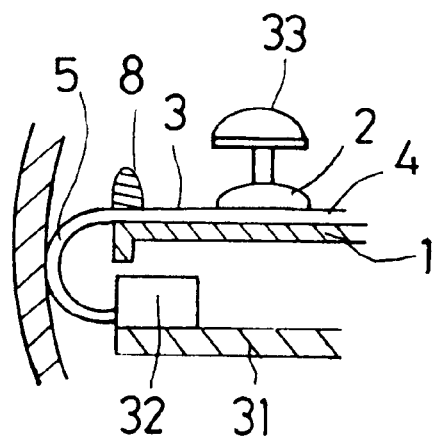

As shown in FIG. 3(a), the flexible sheet 3 is electrically connected to a circuit board 31 provided below the chassis 1. Referring to FIG. 4, respective manual buttons 33 are arranged above flexible switches 2, and are inserted into holes 44 provided with the upper case 41 in corresponding to a position of each flexible switch 2, whereby the manual buttons can be depressed externally from the case.

A liquid crystal panel 45 is also bonded on to the chassis 1, and fitted to an opening 46 provided with the upper case 41 in corresponding to a position for fixing the panel 45 thereon. The display of the panel 45 can be viewed externally from a case through a transparent resin cover 49 covering the opening 46. Installed on the lower case 42 are an antenna 47 and an RF circuit 48.

Figure 2:
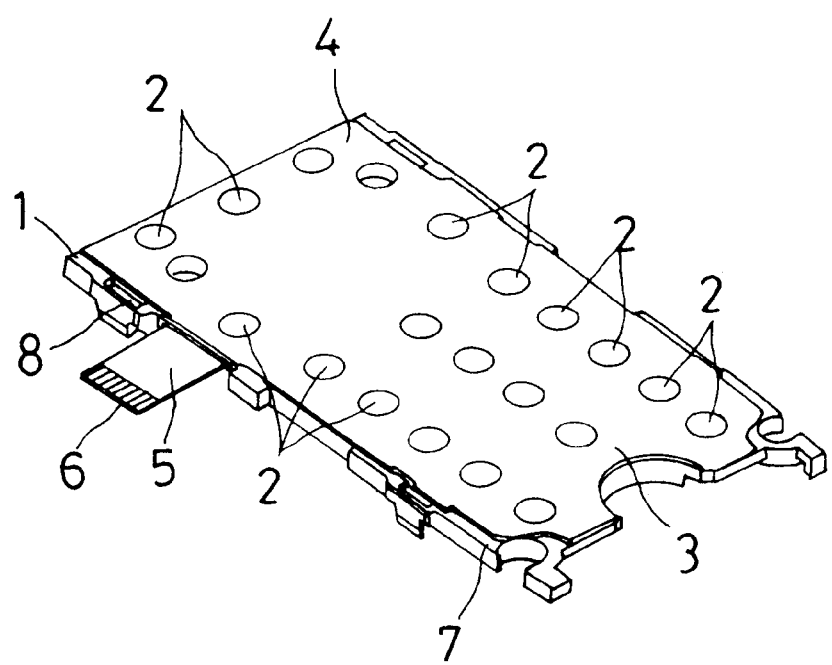
FIG. 2 is a perspective view showing the shape of a chassis and a flexible sheet.

With respect to FIG. 1(a), FIG. 1(b), and FIG. 2, the flexible sheet 3 comprises a flat plate portion 4 being in close contact with a surface of the chassis 1 and a flat cable portion 5 extending on an edge of the flat plate portion 4. The flat plate portion 4 is formed with a plurality of flexible switches 2. Disposed on an end of the flat cable portion 5 of the flexible sheet 3 is a terminal portion 6 to be connected to a connector 32 on the circuit board.

The chassis 1 has a flat plate portion 7 bonding to the flexible sheet 3. An end portion of the flat plate portion is formed with a lift-up prevention piece 8 for having the flat cable portion 5 of the flexible sheet 3 inserted therein. A lift-up prevention piece 8 may be constructed as a hook to hook the flexible sheet 3.

Referring to FIG. 1(a), the flat plate portion 4 of the flexible sheet 3 is in close contact with the plate portion 7 of the chassis 1. The present invention is characterized in that the flat cable portion 5 of the flexible sheet 3 is inserted into the lift-up prevention piece 8 to prevent a part of the flat plate portion 4 of the flexible sheet 3 from being lifted up, as shown in FIG. 1(b). This obviates the problem that a user feels dull click in depressing the manual button or the manual button is locked.

With respect to FIG. 3(a), the flat cable portion 5 of the flexible sheet 3 is inserted into the lift-up prevention piece 8 to have a terminal portion 6 on its end connected to a connector 32 on the circuit board 31 below the chassis 1. This prevents a part of the flexible sheet 3 from being lifted up, whereby the flat plate portion 4 of the flexible sheet 3 which is provided with a plurality of flexible switches 2 is in intimate contact with a surface of the chassis 1. Consequently, as shown in FIG. 3(b), the manual button 33 which functions integrally with a flexible switch 2 will never slant to produce no trouble in manipulation.

As in the foregoing statement, a part of the flexible sheet can be restrained from being lifted up according to the present invention to prevent faulty action including dull click of the flexible switch and locking resulting from the reaction force or clearance caused by the lift-up of a part of the flexible sheet.

What is claimed is:

1. Construction of fixing a flexible sheet for use in an electronic device comprising a case being formed with a plurality of through holes, a chassis being accommodated in an interior of the case, a flexible sheet being disposed on a surface of the chassis and having a plurality of flexible switches arranged thereon, a circuit board being provided below the chassis and having a connector fixed thereon, and a plurality of manual buttons being provided above each flexible switch and being exposed from the through holes of the case to the outside of the case, the construction of fixing the flexible sheet wherein the flexible sheet comprises a flat plate portion being in close contact with the chassis and a flat cable portion which projects on an edge of the flat plate portion and with which a connecting terminal portion is provided on its end, the flat cable portion is folded back to the chassis to have the connecting terminal portion connected to the connector, and the chassis is provided with a lift-up prevention piece to prevent a part of the flat plate portion of the flexible sheet from being lifted up from a surface of the chassis.

2. Construction of fixing the flexible sheet according to claim 1 wherein the lift-up prevention piece holds the flat cable portion of the flexible sheet to prevent a part of the flexible sheet from being lifted up.

3. Construction of fixing the flexible sheet according to claim 2 wherein the lift-up prevention piece has a through hole into which the flat cable portion of the flexible sheet is inserted to hold the flat cable portion of the flexible sheet.

4. Construction of fixing the flexible sheet according to claim 2 wherein the lift-up prevention piece is formed into a hook-shape being capable to hook the flat cable portion of the flexible sheet to have the flat cable portion of the flexible sheet held.

* * * * *